US007367382B2

(12) United States Patent
Miyazawa et al.

(10) Patent No.: US 7,367,382 B2
(45) Date of Patent: May 6, 2008

(54) HEAT-EMITTING ELEMENT COOLING APPARATUS AND HEAT SINK (75) Inventors: Masashi Miyazawa, Nagano (JP); Tomoaki Ikeda, Nagano (JP); Toshiki Ogawara, Nagano (JP)

(73) Assignee: Sanyo Denki Co., Ltd., Tokyo (JP)

( * ) Notice: Subject to any disclaimer, the term of this patent is extended or adjusted under 35 U.S.C. 154(b) by 183 days.

(21) Appl. No.: 11/383,057

(22) Filed: May 12, 2006

(65) Prior Publication Data
US 2006/0254750 A1 Nov. 16, 2006

(30) Foreign Application Priority Data
May 12, 2005 (JP) ............................. 2005-140396

(51) Int. Cl.
*H05K 15/20* (2006.01)
(52) U.S. Cl. ...................... 165/80.3; 165/185
(58) Field of Classification Search .............. 165/80.2, 165/80.3, 185; 361/697, 703; 257/720, 257/722
See application file for complete search history.

(56) References Cited
U.S. PATENT DOCUMENTS 5,486,980 A * 1/1996 Jordan et al. ............... 165/185
6,310,774 B1 * 10/2001 Lee ............................ 165/185
6,446,708 B1 * 9/2002 Lai ............................ 165/80.3
6,945,319 B1 * 9/2005 Li et al. ..................... 165/185
2002/0195229 A1 * 12/2002 Hsieh et al. ................ 165/80.3
2004/0035554 A1 * 2/2004 Sato et al. .................. 165/80.3

FOREIGN PATENT DOCUMENTS
JP 3085340 2/2002

* cited by examiner

*Primary Examiner*—Teresa J. Walberg
(74) *Attorney, Agent, or Firm*—Rankin, Hill & Clark LLP (57) ABSTRACT

The present provides a heat-emitting element cooling apparatus which has a higher heat-emitting efficiency than that of conventional heat-emitting element cooling apparatus.

A heat-emitting element cooling apparatus 1 includes a heat sink 7 and a fan unit 5. The heat sink 7 has a base 33 onto which a heat-emitting element is to be mounted, radiation fins of a first type 35, and radiation fins of a second type 37. The radiation fins 35 extend from an upper surface 33A in an upward direction. The radiation fins 37 extend from either of two side surfaces 33B and 33C in either of rightward and leftward directions. The radiation fins 35 and 37 continuously extend in forward and rearward directions respectively.

8 Claims, 5 Drawing Sheets

HEAT-EMITTING ELEMENT COOLING APPARATUS AND HEAT SINK

BACKGROUND OF THE INVENTION

The present invention relates to a heat-emitting element cooling apparatus for cooling a heat-emitting element such as electronic components, and a heat sink which is employed therein.

A conventional heat-emitting element cooling apparatus receives a heat sink for cooling an electronic component, which emits heat of a high temperature, such as CPU, and other heat-emitting elements in an air channel. In this apparatus, a wind is fed from a fan unit into the air channel, and the electronic components are forcibly cooled down. The heat sink includes a base onto which a heat-emitting element such as CPU to be cooled is to be mounted, and a plurality of radiation fins fixedly provided at the base. Furthermore the fan unit is arranged at a side of the heat sink and feeds air in one direction along the plurality of radiation fins, thereby enhancing heat radiation from the radiation fins.

U.S. Pat. No. 6,446,708 (Japan Utility Model Registration No. 3,085,340) discloses one example of a heat sink which can be employed for the technology of this kind. A heat sink of this kind is provided with two extending portions extending diagonally in an upward direction as if the wings are spreading above a body portion of the base, onto which a heat-emitting element is to be mounted. A plurality of radiation fins, extending in either of an upward direction or a downward direction, are integrally provided at either of an upper end portion or a lower end portion of the two extending portions. The plurality of radiation fins are divided into a plurality of strips, and end portions of the plurality of strips extending from lower end portions of the extending portions in the downward direction are connected with each other.

In the conventionally proposed heat sinks, heat which has been transferred from a heat-emitting element to a body portion of a base is not radiated immediately after transferred. The heat is radiated after the heat has been transferred to the plurality of strips provided at each of the extending portions. When each of the radiation fins is divided into the plurality of strips, heat radiation efficiency seems to be improved. However, since the total cross sectional area of heat passages where the heat passes decreases, the heat radiation efficiency is lowered. Furthermore the plurality of strips provided at each of the lower end portions of the two extending portions extend straight in a downward direction. The end portions of the strips are connected with each other. Therefore the heat passages, where the heat passes from the heat-emitting element to the end portions of the plurality of strips provided at the lower end portions of the extending portions, are lengthened. Also components located in a vicinity of the heat-emitting element are more readily heated, due to radiant heat which is radiated from the plurality of strips provided at the lower end portions of the extending portions. There has been a limit, due to its construction, for enhancing cooling efficiency in the cooling apparatus which has been conventionally proposed, even though the heat sink is arranged in the air channel for cooling.

SUMMARY OF THE INVENTION

An object of the present invention is to provide a heat-emitting element cooling apparatus which has a higher heat-radiation efficiency than that of a conventional apparatus.

Another object of the present invention is to provide a heat sink which has a higher heat-radiation efficiency than that of a conventional heat sink.

A heat-emitting element cooling apparatus according to the present invention includes a base onto which a heat-emitting element to be cooled is to be mounted, and a plurality of radiation fins fixedly provided at the base. The heat-emitting element cooling apparatus also includes a fan unit arranged at a side of the heat sink, for feeding air in one direction along the plurality of radiation fins to enhance heat radiation from the radiation fins.

When an upward direction and a downward direction are assumed as being orthogonal to the one direction, a rightward direction and a leftward direction of the base are defined as coinciding with two directions orthogonal to both of the one direction and the upward and downward directions, and one of the forward and rearward directions of the base is defined as coinciding with the one direction.

The heat-emitting element is arranged at a downward side of the base in such a manner that heat from the heat-emitting element can be transferred to the base. The heat-emitting element can be arranged in such a manner that the heat-emitting element is directly in contact with a surface, which faces in a downward direction, of the base, or a lower surface of the base. With this arrangement, the heat from the heat-emitting element is immediately transferred to a heat-transferring member, and then ensured to be transferred to the body portion of the base.

The base of the heat sink includes a body portion extending in the rightward and leftward directions and in the forward and rearward directions, and a first extending portion and a second extending portion, of which base portions are integrally provided at the body portion of the base. The body portions of the base has upper corner portions and lower corner portions that are located at either end of the base in the rightward and leftward directions, and the base portion of the first and second extending portions are integrally provided each at the upper corner portions and continuously extend in the forward and rearward directions. The first extending portion extends in a first inclining direction between the upward direction and one of the rightward and leftward directions so that a distance between the first and second extending portions at positions apart from the base is longer than a distance between the first and second extending portions at positions close to the base. The second extending portion extends in a second inclining direction between the upward direction and the other one of the rightward and leftward directions so that a distance between the first and second extending portions at positions apart from the base is longer than a distance between the first and second extending portions at positions close to the base. The first and second extending portions do not need to extend linearly, but of course can curvingly extend.

The plurality of radiation fins include a plurality of radiation fins of a first type and a plurality of radiation fins of a second type. The base portions of the radiation fins of the first type are integrally provided at an upper surface, which faces in the upward direction of the base, of the base, and the base portions of the radiation fins of the second type are integrally provided at each of two side surfaces, which respectively face in the rightward and leftward directions, of the base. On the upper surface of the base, of course, there can be a portion which is not included in the first or second extending portion. When there is such a portion on the upper surface, the radiation fins of the first type may be provided thereon. The plurality of radiation fins of the first type continuously extend in the upward direction and in the forward and rearward directions.

The plurality of radiation fins of the second type, of which the base portions are integrally provided at one of the two sides of the base, continuously extend in one of the rightward and leftward directions and in the forward and rearward directions. The plurality of radiation fins of the second type, of which the base portions are integrally provided at the other one of the two sides of the base, continuously extend in the other one of the rightward and leftward directions and in the forward and rearward directions. The plurality of radiation fins of the second type do not need to extend straight in a direction which perfectly coincides with the rightward and leftward directions. The plurality of radiation fins of the second type, of course, may incline at certain degrees, or curvingly extend along (toward) the rightward and leftward directions.

According to the present invention, since the plurality of radiation fins of the first and second types continuously extend in the forward and rearward directions, the radiation fins are not an extremely serious obstacle against air flows flowing along the radiation fins. A decrease in the total cross sectional area of heat passages, which extend from the heat-emitting element to end portions of the radiation fins, can also be suppressed. Since the radiation fins of the second type extend in the rightward and leftward directions, the radiant heat from the radiation fins of the second type is not entirely inflicted on components around the heat-emitting element. More specifically, out of the radiation fins of the second type, the radiation fins extending from two side surfaces of the base are located closer to the heat-emitting element, thereby actively dissipating the heat from the heat-emitting element, as early as possible. With the above-mentioned arrangement, cooling efficiency can be enhanced more than ever.

The base portions of the plurality of radiation fins provided at upper surfaces, which face in the upward direction, of the first and second extending portions, and the base portions of the plurality of radiation fins provided at lower surfaces, which face in the downward direction, of the first and second extending portions may not be aligned. With this arrangement, heat flowing from the base portions to end portions of the first and second extending portions can be evenly dispersed to the radiation fins, thereby increasing heat radiation efficiency.

When the first and second extending portions extend linearly, an angle between the first inclining direction and the upward direction is preferably equal to an angle between the second inclining direction and the upward direction. With this arrangement, heat can be dispersed in balance, thereby preventing an uneven heat radiation.

A preferable fan unit is an axial flow fan unit which includes a motor, an impeller fixedly and rotatably provided at a rotor of the motor, a housing having a cylindrical air channel in which the impeller is rotatably received, and a plurality of webs which are arranged between the housing and the motor to support the motor. The fan unit is constructed to blow air onto the plurality of radiation fins.

According to the present invention, the plurality of radiation fins of the first and second types continuously extend in the forward and rearward directions. Therefore the radiation fins are not an extremely serious obstacle against air flows flowing along the radiation fins. According to the present invention, it is beneficial that a decrease in the total cross sectional area of heat passages, which extend from the heat-emitting element to end portions of the radiation fins, can also be suppressed. Since the radiation fins of the second type extend in the rightward and leftward directions, the radiant heat from the radiation fins of the second type is not entirely inflicted on components around the heat-emitting element. More specifically, it is also beneficial that, out of the radiation fins of the second type, the radiation fins extending from two side surfaces of the base are located closer to the heat-emitting element, thereby actively dissipating the heat from the heat-emitting element, as early as possible.

DETAILED DESCRIPTION OF PREFERRED EMBODIMENT

Figure 1:
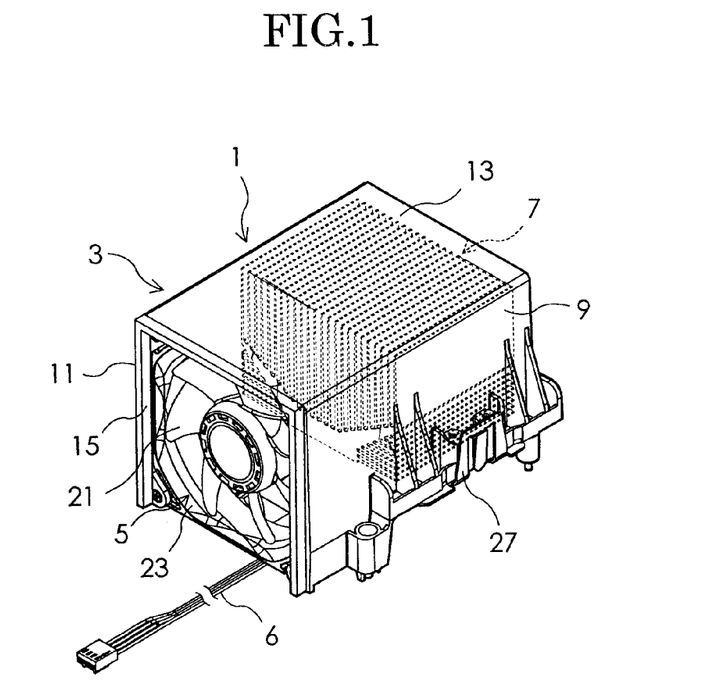
FIG. 1 is a perspective view of an embodiment where the present invention is applied to an electronic component cooling apparatus, or a heat-emitting element cooling apparatus, for cooling electronic components such as CPU using an air channel.
Figure 2:
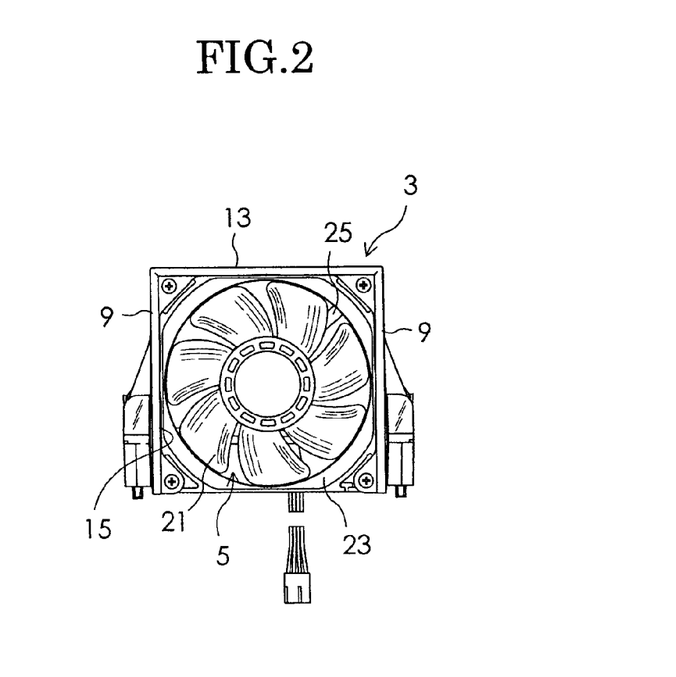
FIG. 2 is a front elevation view of the embodiment of FIG. 1.
Figure 3:
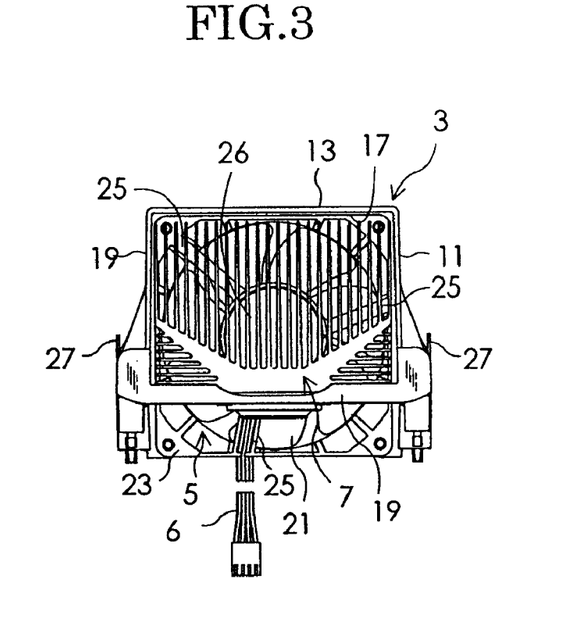
FIG. 3 is a rear elevation view of the embodiment of FIG. 1.
Figure 4:
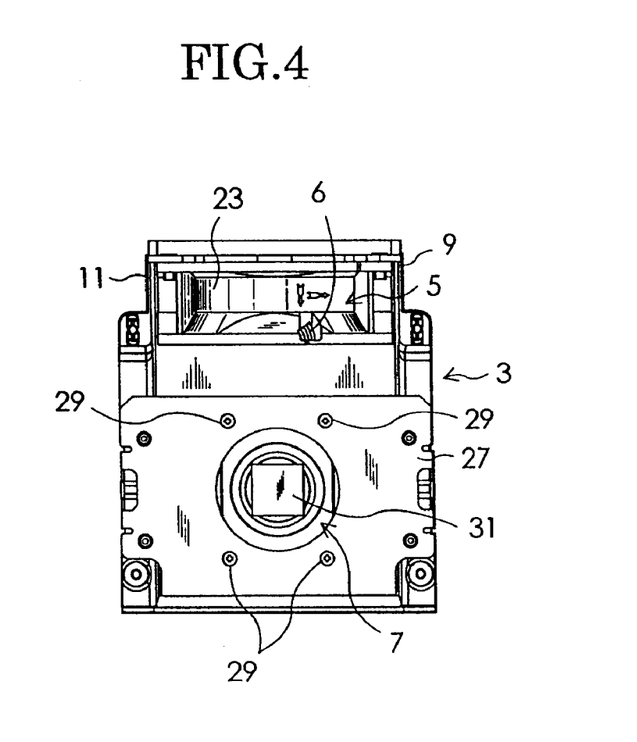
FIG. 4 is a bottom plan view of the embodiment of FIG. 1.

FIG. 1 is a perspective view of an embodiment where the present invention is applied to an electronic component cooling apparatus, or a heat-emitting element cooling apparatus. The electronic component cooling apparatus includes a heat sink onto which electronic components such as CPU is mounted in an air channel thereof, and cools down electronic components such as CPU. FIG. 2 is a front elevation view of the embodiment. FIG. 3 is a rear elevation view of the embodiment. FIG. 4 is a bottom plan view of the embodiment. In the electronic components cooling apparatus 1, a fan unit 5 and a heat sink 7 illustrated with dotted lines are housed in the air channel 3. A member indicated with a reference numeral 6 is a power-source cord of the fan unit 5.

The air channel 3 includes a pair of side walls 9 and 11, and an upper wall 13. A bottom surface of the air channel 3 is open. The bottom surface of the air channel 3 is, for example, covered with a board onto which the apparatus 1 is to be mounted. Therefore, considering from functionality of the air channel, the air channel 3 can be considered as being closed at a bottom thereof. Also considering from functionality of the air channel, the air channel 3 has a pair of opening portions 15 and 17 in forward and rearward directions. In the one opening portion 15 of the air channel 3, the fan unit 5 is received. Furthermore, in the air channel 3, the heat sink 7 is received in such a manner that the heat sink can be seen from a side of the opening portion 17. As shown in FIG. 3, the air channel 3 includes a crosspiece portion 19, of which both ends are integrally provided at the pair of side walls 9 and 11 at an end of the opening portion 17.

The fan unit 5 is an axial flow fan of which a housing 23 receives an impeller 21. As shown in FIG.3 a motor 26 for driving the impeller 21 is supported by the housing 23 via three webs 25. In this embodiment, the fan unit 5 is arranged in the air channel 3 in such a manner that the webs 25 are arranged at a side of the heat sink 7. The fan unit 5 draws in air from a side of the opening portion 15 and feeds air to a side of the webs 25. In this cooling apparatus, air wind which has been fed by the fan unit 5 flows along the heat sink 7, and flows out of the opening portion 17. Accordingly heat radiation from the heat sink 7 is enhanced. The heat sink 7 is fixed with 4 screws 29 to brackets 27, which are fixedly provided at the pair of side walls 9 and 11 of the air channel 3, and supported in the air channel 3.

As shown in FIG.4, CPU, a heat-emitting element 31, is mounted onto a base 33 of the heat sink 7 in such a manner that heat can be transferred, as described later.

Figure 5:
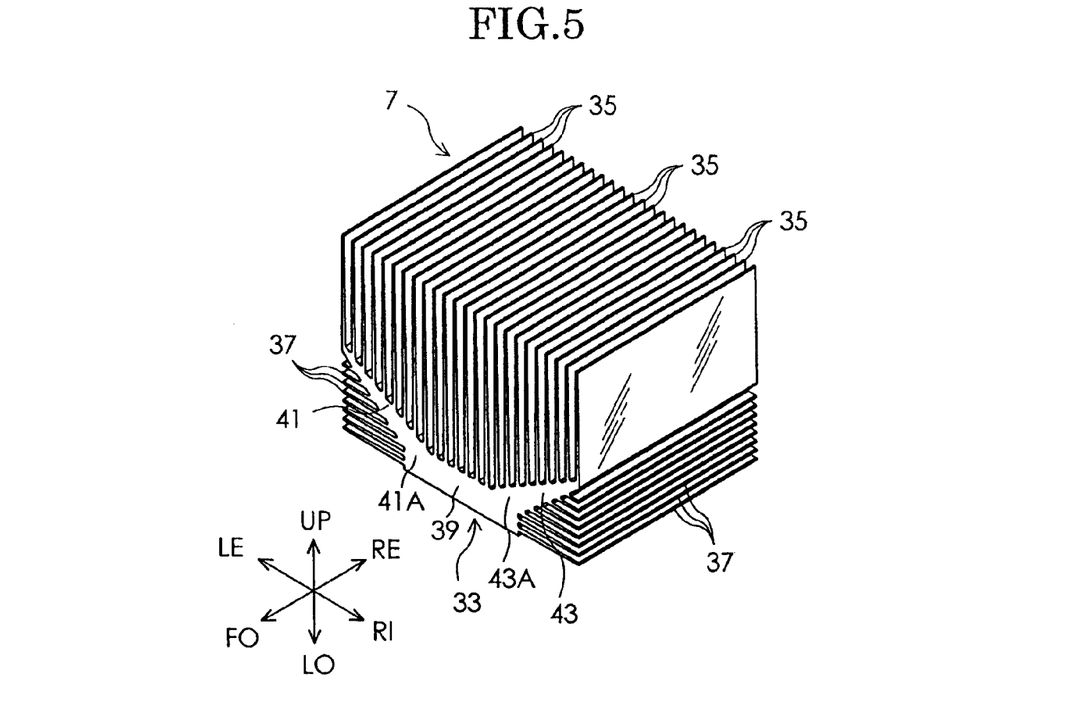
FIG. 5 is a perspective view of a heat sink as viewed from upper right in front.
Figure 6:
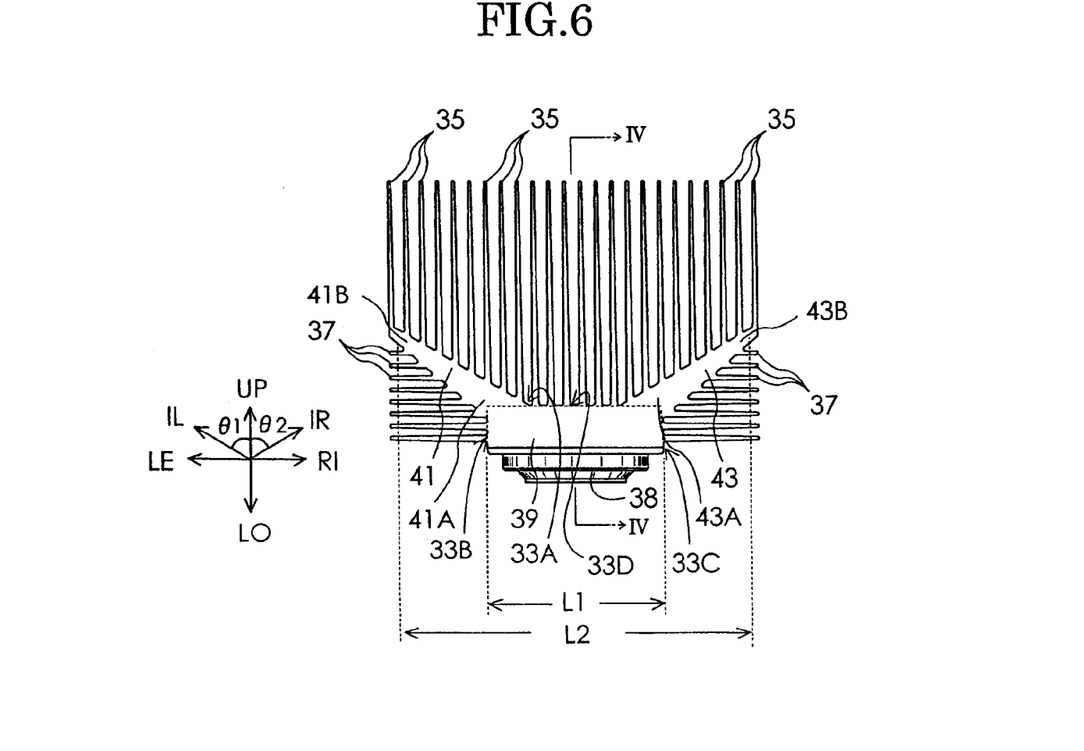
FIG. 6 is a front elevation view of a heat sink.
Figure 7:
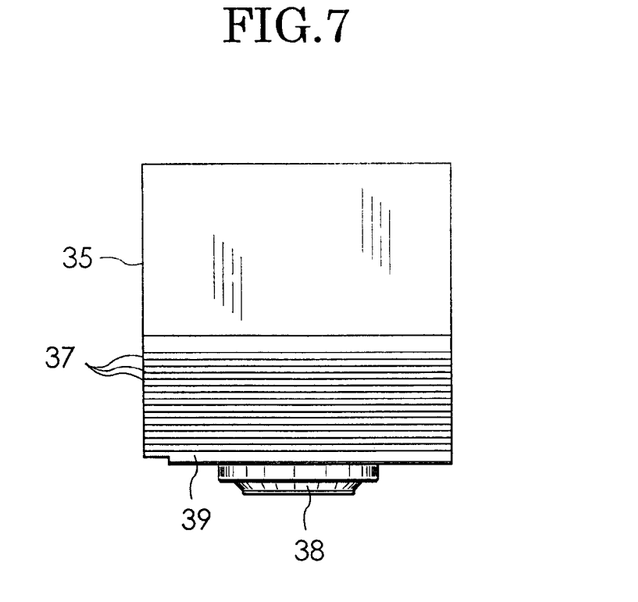
FIG. 7 is a right side elevation view of the heat sink.
Figure 8:
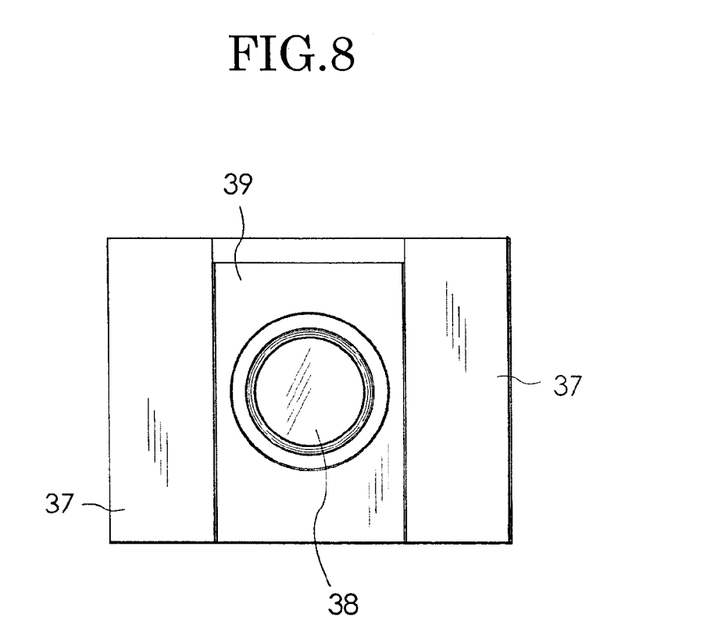
FIG. 8 is a bottom plan view of the heat sink.
Figure 9:
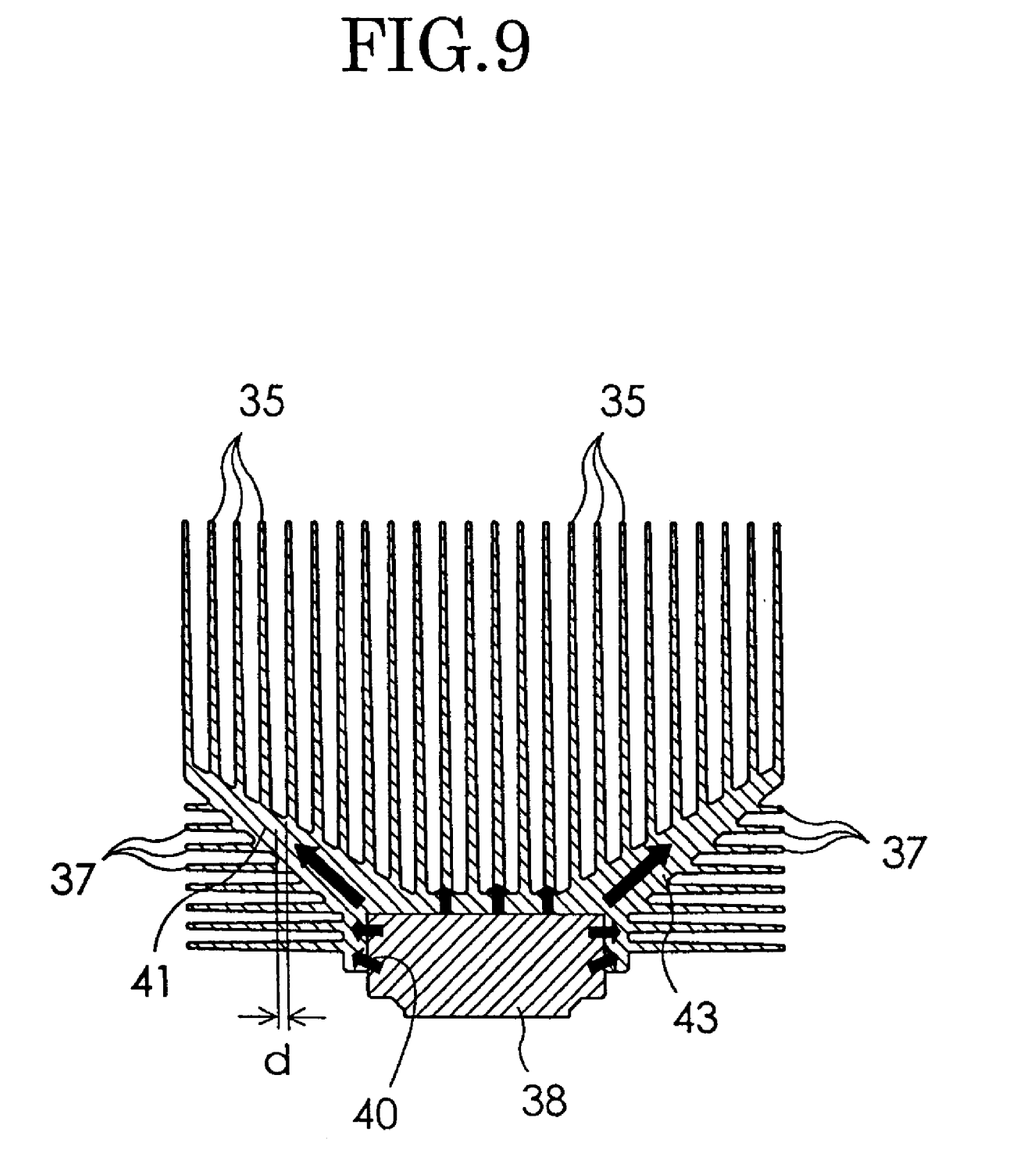
FIG. 9 is a cross sectional view as taken along a line IX-IX of FIG. 6.

FIG. 5 is a perspective view of the heat sink 7 as viewed from upper right in front. FIG. 6 is a front elevation view of the heat sink 7. FIG. 7 is a side elevation view of the heat sink 7. FIG. 8 is a bottom plan view of the heat sink 7. FIG. 9 is a cross sectional view as taken along a line IX-IX of FIG. 6. As shown in FIG. 5 and FIG. 6, a plurality of directions are defined in respect of the heat sink 7 in this specification of the present invention. In other words, upward and downward directions include an upward direction UP and a downward direction LO, forward and rearward directions include a forward direction FO and a rearward direction RE, and rightward and leftward directions include a rightward direction RI and a leftward direction LE, as shown in FIG. 5. Furthermore a direction in which air is fed by the fan unit 5 (one of the directions of an axial line of an axial flow fan unit) is defined as one direction, which is a rearward direction RE in the embodiment. With respect to the one direction, the upward and downward directions and the rightward and leftward directions are defined.

The heat sink 7 includes a base 33 onto which a heat-emitting element 31 to be cooled is to be mounted, and a plurality of radiation fins 35 and 37 which are fixedly provided at the base 33. Reference numerals 35 and 37 are given only to a part of radiation fins in FIG. 5 to FIG. 9. In this embodiment, the base 33 and the radiation fins 35 and 37 are integrally formed by extrusion moldering using an aluminum material. A heat transferring member 38, made of materials such as copper having a higher conductivity than that of aluminum, is arranged on a bottom portion of the base 33.

The base 33 includes a body portion 39 which extends in the rightward and leftward directions LE-RI, and in the forward and rearward directions FO-RE, and a first extending portion 41 and a second extending portion 43 of which the base portions 41A and 43A are integrally provided at the body portion 39 of the base 33. The body portion 39 of the base 33 has upper corner portions and lower corner portions that are located at either end of the body portion 39 of the base 33 in the rightward and leftward directions, and the base potions 41A, 43A of the first and second extending portions 41, 43 are integrally provided each at the upper corner portions and continuously extend in the forward and rearward directions FO-RE. Since the first and second extending portions 41, 43 are integrally provided at the body portion 39, the upper corner portions of the body portion 39 are illustrated with dotted lines as shown in FIG. 6 in this specification of the present invention.

As shown in FIG.6, the first extending portion 41 extends in a first inclining direction IL between the upward direction UP and the leftward direction LE so that a distance L2 between the first and second extending portions 41 and 43 at positions apart from the base 33 is longer than a distance L1 between the first and second extending portions 41 and 43 at positions close to the base 33. Likewise, the second extending portion 43 extends in a second inclining direction IR between the upward direction UP and the rightward direction RI so that a distance L2 between the portions 41B and 43B, of the first and second extending portions 41 and 43, at positions apart from the base 33 is longer than a distance L1 between the portions 41A and 43A, of the first and second extending portions 41 and 43, at positions close to the base 33. In this embodiment, the first and second extending portions 41 and 43 linearly extend.

An angle θ1 between the first inclining direction IL and the upward direction UP is same as an angle θ2 between the second inclining direction IR and the upward direction UP.

The plurality of radiation fins 35 and 37 include 24 pieces of radiation fins 35 of a first type, and 16 pieces of radiation fins 37 of a second type. In this embodiment, the base portions of the radiation fins 35 of the first type are integrally provided at an upper surface 33A, which faces in the upward direction of the base 33, and the base portions of the radiation fins 37 of the second type are integrally provided at each of two side surfaces 33B and 33C, which respectively face in the rightward and leftward directions of the base 33. In this embodiment, on the upper surface 33A of the base 33, of course, there is a portion 33D which dose is not included in the first extending portion 41 or the second extending portion 43. On the portion 33D, the radiation fins 35 of the first type are also provided. The plurality of radiation fins 35 of the first type continuously extend in the upward direction UP and in the forward and rearward directions FO-RE. Thickness of the radiation fins 35 and 37 becomes thinner from the base portion toward each of end portions thereof.

The radiation fins 37 of the second type, of which the base portions are integrally provided at a side surface 33B of the base, continuously extend in the leftward direction LE and in the forward and rearward directions FO-RE. The radiation fins 37 of the second type, of which the base portions are integrally provided at a side surface 33C of the base, continuously extend in the rightward direction RI and in the forward and rearward directions FO-RE. The radiation fins 37 of the second type do not need to extend straight in a direction which perfectly coincides with the rightward and leftward directions. The plurality of radiation fins 37 of the second type, of course, can incline at certain degrees, or curvingly extend along (toward) in the rightward and leftward directions.

As shown in FIG. 9, the base portions of the plurality of the radiation fins 35 provided at upper surface, which face in the upward direction UP, of the first and second extending portions 41 and 43, and the base portions of the plurality of the radiation fins 37 provided at lower surfaces, which face in the downward direction LO, of the first and second extending portions 41 and 43 may not be aligned. There is a difference (d) between the position of the base portion of the radiation fin 35 and that of the radiation fin 37. With this arrangement, heat flowing from the base portions 41A and 43A to end portions 41B and 43B of the first and second extend portions 41 and 43 can be evenly dispersed to each of the radiation fins 35 and 37, thereby enhancing heat radiation efficiency.

As shown in FIG. 9, a concave portion 40 which opens in the downward direction is formed in the body portion 39 of the heat sink 7. A heat transferring member 38 is tightly engaged into the concave portion 40 in such a manner that heat from the heat-emitting element can be transferred to the base. The heat transferring member 38 is composed of a cylindrical body having a circular cross section. Since the heat-transferring member 38 is disposed deeply inside the body portion 39, the heat from the heat-emitting element is smoothly, effectively transferred from the heat-transferring member 38 to the extending portions 41 and 43, and also to the radiation fins 35 and 37, as indicated with arrows in FIG. 9. The heat transferred to the radiation fins 35 is further transferred to end portions of the radiation fins 35 in the upward direction. The heat transferred to the radiation fins 37 is further transferred to end portions of the radiation fins 37 in either of the rightward or leftward direction.

In this embodiment, the heat-emitting element is mounted onto the base of the heat sink 7 through the heat transferring member 38. However, the heat-emitting element, of course, can be arranged to be in direct contact with a surface (lower surface) which faces in a downward direction of the base.

In this embodiment, an air channel 3 is employed. However, a heat-emitting element cooling apparatus, of course, can be constructed to cool down the heat sink 7 is cooled without using an air channel 3.

Further, the present invention is not limited to this embodiment, but various variations and modifications may be made without departing from the scope of the present invention.

What is claimed is:

1. A heat-emitting element cooling apparatus comprising:
a heat sink including a base onto which a heat-emitting element to be cooled is to be mounted, and a plurality of radiation fins fixedly provided at the base, and
a fan unit arranged at a side of the heat sink, for feeding air in one direction along the plurality of radiation fins to enhance heat radiation from the radiation fins;
wherein, when an upward direction and a downward direction are assumed as being orthogonal to the one direction, a rightward direction and a leftward direction of the base are defined as coinciding with two directions orthogonal to both of the one direction and the upward and downward directions, and one of forward direction and rearward direction of the base is defined as coinciding with the one direction;
wherein the heat-emitting element is arranged at a side of the downward direction of the base in such a manner that heat from the heat-emitting element can be transferred to the base;
wherein the base includes a body portion extending in the rightward and leftward directions and in the forward and rearward directions, and a first extending portion and a second extending portion, of which base portions are integrally provided at the body potion of the base;
wherein the body portion of the base has upper corner portions and lower corner portions that are located at either end of the body portion of the base in the rightward and leftward directions, and the base portions of the first and second extending portions are integrally provided each at the upper corner portions and continuously extend in the forward and rearward directions;
wherein the first extending portion extends in a first inclining direction between the upward direction and one of the rightward and leftward directions so that a distance between the first and second extending portions at positions apart from the base is longer than a distance between the first and second extending portions at positions close to the base;
wherein the second extending portion extends in a second inclining direction between the upward direction and the other one of the rightward and leftward directions so that a distance between the first and second extending portions at positions apart from the base is longer than a distance between the first and second extending portions at positions close to the base;
wherein the plurality of radiation fins include a plurality of radiation fins of a first type and a plurality of radiation fins of a second type, base portions of the plurality of radiation fins of the first type being integrally provided at an upper surface of the base which faces in the upward direction of the base, base portions of the plurality of radiation fins of the second type being integrally provided at each of two side surfaces of the base which respectively face in the rightward and leftward directions;
wherein the plurality of radiation fins of the first type continuously extend in the upward direction and in the forward and rearward directions;
wherein the plurality of radiation fins of the second type, of which the base portions are integrally provided at one of the two side surfaces of the base, continuously extend in one of the rightward and leftward directions and in the forward and rearward directions; and
wherein the plurality of radiation fins of the second type, of which the base portions are integrally provided at the other one of the two sides of the base, continuously extend in the other one of the rightward and leftward directions and in the forward and rearward directions.

2. The heat-emitting element cooling apparatus as defined in claim 1, wherein a heat transferring member having a higher heat conductivity than that of the body portion is provided at the body portion of the base and a heat-emitting element is in direct contact with the heat transferring member.

3. The heat-emitting element cooling apparatus as defined in claim 1, wherein the plurality of radiation fins of the first type are arranged substantially in parallel with each other, and the plurality of radiation fins of the second type are also arranged substantially in parallel with each other.

4. The heat-emitting element cooling apparatus as defined in claim 1, wherein the base portions of the plurality of the radiation fins provided at upper surfaces, which face in the upward direction, of the first and second extending portions, and the base portions of the plurality of the radiation fins provided at lower surfaces, which face in the downward direction, of the first and second extending portions are not aligned in the upward and downward directions.

5. A heat sink comprising:
a base onto which a heat-emitting element to be cooled is to be mounted, and
a plurality of radiation fins fixedly provided at the base,
wherein air, supplied to flow in one direction by a fan unit arranged at a side of the heat sink, flows along the plurality of radiation fins to radiate heat of the heat-emitting element;
wherein, when an upward direction and a downward direction are assumed as being orthogonal to the one direction, rightward direction and a leftward direction of the base are defined as coinciding with two directions orthogonal to both of the one direction and the upward and downward directions, and one of forward and rearward directions of the base is defined as coinciding with the one direction;

wherein the base includes a body portion extending in the rightward and leftward directions and in the forward and rearward directions, and a first extending portion and a second extending portion, of which base portions are integrally provided at the body potion of the base;

wherein the body portion of the base has upper corner portions and lower corner portions that are located at either end of the body portion of the base in the rightward and leftward directions, and the base portions of the first and second extending portions are integrally provided each at the upper corner portions and continuously extend in the forward and rearward directions;

wherein the first extending portion inclines in a first inclining direction between the upward direction and one of the rightward and leftward directions so that a distance between the first and second extending portions at positions apart from the base is longer than a distance between the first and second extending portions at positions close to the base;

wherein the second extending portion inclines in a second inclining direction between the upward direction and the other one of the rightward and leftward directions so that a distance between the first and second extending portions at positions apart from the base is longer than a distance between the first and second extending portions at positions close to the base;

wherein the plurality of radiation fins include a plurality of radiation fins of a first type and a plurality of radiation fins of a second type, base portions of the plurality of radiation fins of the first type being integrally provided at an upper surface of the base which faces in the upward direction of the base, base portions of the plurality of radiation fins of the second type being integrally provided at each of two side surfaces of the base which respectively face the rightward and leftward directions;

wherein the plurality of radiation fins of the first type continuously extend in the upward direction and in the forward and rearward directions;

wherein the plurality of radiation fins of the second type, of which the base portions are integrally provided at one of the two side surfaces of the base, continuously extend in one of the rightward and leftward directions and in the forward and rearward directions; and wherein the plurality of radiation fins of the second type, of which the base portions are integrally provided at the other one of the two sides of the base, continuously extend in the other one of the rightward and leftward directions and in the forward and rearward directions.

6. The heat sink as defined in claim 5, wherein a heat transferring member having a higher heat conductivity than that of the body portion is provided at the body portion of the base and a heat-emitting element is in direct contact with the heat transferring member.

7. The heat sink as defined in claim 5, wherein the plurality of radiation fins of the first type are arranged substantially in parallel with each other, and the plurality of radiation fins of the second type are also arranged substantially in parallel with each other.

8. The heat sink as defined in claim 5, wherein the base portions of the plurality of the radiation fins provided at upper surfaces, which face in the upward direction, of the first and second extending portions, and the base portions of the plurality of the radiation fins provided at lower surfaces, which face in the downward direction, of the first and second extending portions are not aligned in the upward and downward directions.

* * * * *

UNITED STATES PATENT AND TRADEMARK OFFICE
CERTIFICATE OF CORRECTION

PATENT NO.       : 7,367,382 B2
APPLICATION NO.  : 11/383057
DATED            : May 6, 2008
INVENTOR(S)      : Masashi Miyazawa et al.

It is certified that error appears in the above-identified patent and that said Letters Patent is hereby corrected as shown below:

Column 9, Line 7, (Claim 5, Line 21), Delete "potion", Insert --portion--.

Signed and Sealed this

Twelfth Day of August, 2008

JON W. DUDAS
*Director of the United States Patent and Trademark Office*